(12) United States Patent
Chua et al.

(10) Patent No.: US 8,466,057 B2
(45) Date of Patent: Jun. 18, 2013

(54) INTEGRATED CIRCUIT PACKAGING SYSTEM WITH FILLED VIAS AND METHOD OF MANUFACTURE THEREOF

(75) Inventors: Linda Pei Ee Chua, Singapore (SG); Byung Tai Do, Singapore (SG); Reza Argenty Pagaila, Singapore (SG)

(73) Assignee: Stats Chippac Ltd., Singapore (SG)

( * ) Notice: Subject to any disclaimer, the term of this patent is extended or adjusted under 35 U.S.C. 154(b) by 88 days.

(21) Appl. No.: 13/070,789

(22) Filed: Mar. 24, 2011

(65) Prior Publication Data
US 2012/0241973 A1    Sep. 27, 2012

(51) Int. Cl.
*H01L 21/4763*    (2006.01)
*H01L 29/40*    (2006.01)
*H01L 29/06*    (2006.01)

(52) U.S. Cl.
USPC ............................ 438/640; 257/774; 257/623

(58) Field of Classification Search
USPC ........... 257/773–775, 621–623; 438/637–640
See application file for complete search history.

(56) References Cited

U.S. PATENT DOCUMENTS

| | | | |
|---|---|---|---|
| 6,459,150 B1 | 10/2002 | Wu et al. | |
| 6,479,321 B2 | 11/2002 | Wang et al. | |
| 6,536,653 B2 | 3/2003 | Wang et al. | |
| 7,262,082 B1 | 8/2007 | Lin et al. | |
| 2010/0096759 A1* | 4/2010 | Kirby et al. | 257/774 |
| 2010/0123256 A1* | 5/2010 | Yoda et al. | 257/774 |
| 2012/0068327 A1* | 3/2012 | Oganesian et al. | 257/692 |

* cited by examiner

*Primary Examiner* — Calvin Lee
(74) *Attorney, Agent, or Firm* — Ishimaru & Associates LLP

(57) ABSTRACT

A method of manufacture of an integrated circuit packaging system includes: providing a substrate; forming a via hole in the substrate, the via hole having a top end and a bottom end with the bottom end is larger than the top end; forming a pad on the substrate, the pad encloses the top end of the via hole; and reflowing a conductive filler having higher volume than the via hole over the via hole, the conductive filler having a protrusion extending from the bottom end and the bottom end entirely overlaps at least one surface of the protrusion.

20 Claims, 3 Drawing Sheets

INTEGRATED CIRCUIT PACKAGING SYSTEM WITH FILLED VIAS AND METHOD OF MANUFACTURE THEREOF

TECHNICAL FIELD

The present invention relates generally to an integrated circuit packaging system, and more particularly to a system for an integrated circuit packaging system with filled vias.

BACKGROUND ART

Current semiconductor packaging technology often involves tradeoffs between ease and efficiency of manufacturing on the one hand, and various performance drawbacks on the other. For example, a tremendous market growth for high density and high output/input integrated circuit packages has resulted in a trend for electronic products that are lightweight, smaller in size, multi-functional, and with ever increasing higher speeds. Electronic products such as cell phone base products, global positioning systems (GPS), satellites, communication equipment, consumer products, and a vast line of other similar products are in ever increasing global demand.

There is an important need that exists for parts in the package to become thinner and thinner to reduce the size of the whole package effectively without sacrificing performance and speed.

Attempts have failed to provide a complete solution addressing simplified manufacturing processing, time to market, improved reliability, reduced electrical parts on the circuit boards, and size reductions of the circuit boards with increased functionality, leveragability, and increased product features to the consumer.

Thus, an increasing need remains to reduce parts mounted on the circuit boards while increasing functionality. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve reliability and product yields to meet competitive pressures adds an even greater urgency to the critical necessity for finding answers to these problems.

Solutions to these problems have been long sought after but prior developments have not taught or suggested any solutions and, thus, solutions to these problems have long eluded those skilled in art.

DISCLOSURE OF THE INVENTION

The present invention provides a method of manufacture of an integrated circuit packaging system including: providing a substrate; forming a via hole in the substrate, the via hole having a top end and a bottom end with the bottom end is larger than the top end; forming a pad on the substrate, the pad encloses the top end of the via hole; and reflowing a conductive filler having higher volume than the via hole over the via hole, the conductive filler having a protrusion extending from the bottom end and the bottom end entirely overlaps at least one surface of the protrusion.

The present invention provides an integrated circuit packaging system including: a substrate having a via hole in the substrate, the via hole having a top end and a bottom end with the bottom end is larger than the top end; a pad over the top end of the via hole; and a conductive filler filled into the via hole, the conductive filler having a protrusion extending out of the via hole from the bottom end with the bottom end entirely overlapping at least one surface of the protrusion.

Certain embodiments of the invention have other steps or elements in addition to or in place of those mentioned above. The steps or elements will become apparent to those skilled in art from a reading of the following detailed description when taken with reference to accompanying drawings.

BEST MODE FOR CARRYING OUT THE INVENTION

Figure 1:
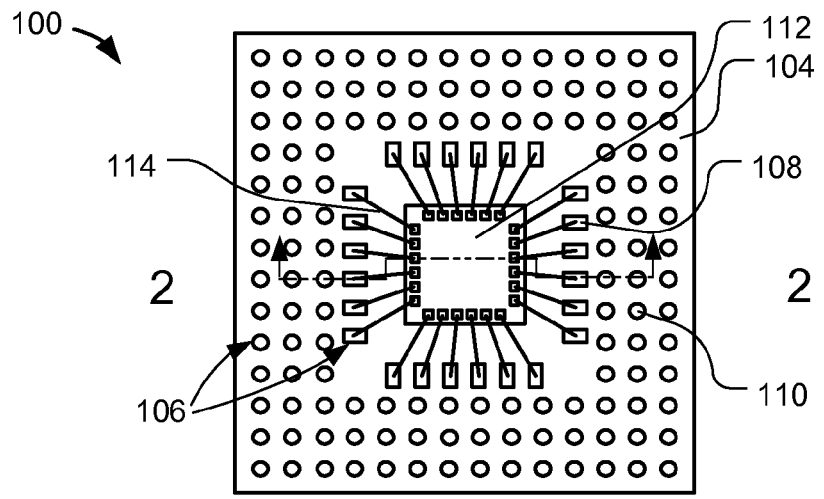
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of an integrated circuit die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements.

The term "processing" as used herein includes deposition of material or photoresist, patterning, exposure, development, etching, cleaning, and/or removal of the material or photoresist as required in forming a described structure.

The term "package-on-package" ("PoP") as used herein includes packaging of devices, where each of the packages can be packaged and tested separately, and then stacked together in package form, wherein at least one package rests on top of another.

The term "Fan-In Package-on-Package" ("FiPoP") as used herein making connections between packages by means of a center ball array instead of a peripheral ball array, thereby decoupling the size of the top package from that of the bottom package.

Referring now to FIG. 1, therein is shown a top plan view of an integrated circuit packaging system 100 in a first embodiment of the present invention. The top plan view depicts the integrated circuit packaging system 100 without a cover. The integrated circuit packaging system 100 can include a substrate 104 with pads 106 including interior pads 108 and peripheral pads 110.

Each of the pads 106 is defined as a conductive structure on the substrate 104. The integrated circuit packaging system 100 can also have a die 112 attached to the substrate 104 with die interconnects 114 attached to the interior pads 108 and the die 112. The interior pads 108, pads close to the die 112, are a subset of the pads 106 for attaching the die interconnects 114 to the die 112. The peripheral pads 110, pads away from the die 112, are a subset of the pads 106 for attaching other external interconnects to the integrated circuit packaging system 100.

Figure 2:
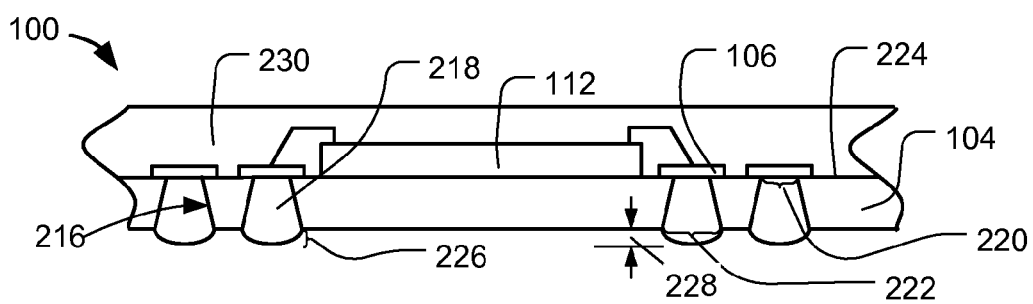
FIG. 2 is a cross-sectional view of the integrated circuit packaging system along line 2-2 of FIG. 1.

Referring now to FIG. 2, therein is shown a cross-sectional view of the integrated circuit packaging system 100 along line 2-2 of FIG. 1. The integrated circuit packaging system 100 can include the substrate 104. The substrate 104 is defined as a chip carrier such as a laminated substrate or a ceramic substrate.

The substrate 104 can include via holes 216 formed on the substrate 104. The via holes 216 are defined as small apertures formed on the substrate 104 and through the substrate 104. The via holes 216 can have patterns with multiple layers, or can be straight through the substrate 104. The via holes 216 can be filled with conductive filler 218, such as solder or other conductive materials, the conductive filler 218 functions as a channel for an electric power or signal path between one surface of the substrate 104 and another surface of the substrate 104. The via holes 216 can be formed by a number of different methods, such as a die set rigid punch arrays, numerically controlled punches, drills, etches, or lasers.

Each of the via holes 216 can include a top end 220 and a bottom end 222. The top end 220 is defined as an opening of each the via holes 216 facing a top side 224 of the substrate 104. The bottom end 222 of the via holes 216 is defined as an opening of each of the via holes 216 on the opposite side from the top end 220. Each of the via holes 216 can be, for example, a truncated cone shape. The truncated cone shape is a three dimensional shape that tapers smoothly from a flat circular or oval bottom base to a float circular or oval top base.

It has been discovered that the present invention provides the integrated circuit packaging system 100 having increased interconnect reliability and substrate reliability. The via holes 216 with a truncated cone shape serve to allow a larger pad over the top end 220 of the via holes 216 while having the bottom end 222 larger than the top end 220 to provide a wider interconnect surface with external stack packages and systems. The via holes 216 with a truncated cone shape also serve to allow a smooth cut of the via holes 216 without stepped edges when formed on the substrate 104. A larger pad over the top end 220 and a wider interconnect surface on the bottom end 222 increase interconnect reliability of the integrated circuit packaging system 100. A smooth cut of the via holes 216 when formed on the substrate 104 avoids structural defects and hence increases substrate reliability. The via holes 216 with a truncated cone shape thereby increase interconnect reliability and substrate reliability.

The integrated circuit packaging system 100 can also include the pads 106 on the substrate 104. The pads 106 are conductive plates. Each of the pads 106 is planar with the top side 224 of the substrate 104. The pads 106 can be formed or placed on the substrate 104 by a number of different methods, such as welding, plating, etching a pre-existing metal layer, or metal deposition. The pads 106 can be made from metallic materials, such as copper, platinum, gold, silver, solder-wettable metals, or a combination thereof.

Each of the via holes 216 can have a corresponding instance of the pads 106 covering the top end 220 of each of the via holes 216. Each of the pads 106 can be larger than the top end 220 of each of the via holes 216 in order to assure that during a reflow stage of manufacturing, the conductive filler 218 cannot travel upward through the top end 220 of the via holes 216. The pads 106 can be plated or coated with filler-wettable or solder-wettable material on either of its sides.

Each of the via holes 216 can be filled with the conductive filler 218, such as solder. The conductive filler 218 is defined as metal, fusible metal or metal alloy with a melting range or a melting point lower than that of the melting point of the substrate 104, used in a process of joining metallic surfaces. The conductive filler 218 can fill the entirety of the via holes 216. The conductive filler 218 can have a protrusion 226 outside of the bottom end 222 of the via holes 216 with a protrusion height 228 of at least between 10 µm to 245 µm, or preferably between 25 µm to 60 µm, or most preferably between 50 µm to 100 µm.

The protrusion 226 can be in the shape of a hemisphere, where the bottom surface of the hemisphere is the same shape and size as the bottom end 222 of the via holes 216. The protrusion 226 can also be in a shape of a polygon-bottom dome, where the bottom surface of the dome is the same shape and size as the bottom end 222 of the via holes 216. The bottom end 222 of the via holes 216 can entirely overlap at least one surface of the protrusion 226.

It has been discovered that the present invention provides the integrated circuit packaging system 100 having increased packaging capacity and increase system complexity. The conductive filler 218 with the protrusion 226 serves to reduce total package height because the protrusion 226 can be shorter than solder balls which are deposited on flat under bump metallization (UBM). Reduced total package height allows for more electronic components to be packaged together and thus increasing packaging capacity and system complexity. The conductive filler 218 with the protrusion 226 thereby increases packaging capacity and system complexity.

With the protrusion 226 exposed, the integrated circuit packaging system 100 can connect with a package-on-package bottom package (PoPb) without needing additional half cut saw process as compared to a step-molded package. Hence, process flow is more robust than a step-molded PoP package.

It has been discovered that the present invention provides the integrated circuit packaging system 100 having increased interconnect reliability. The protrusion 226 with the bottom end 222 of the via holes 216 entirely overlapping at least one surface of the protrusion 226 serves to eliminate the use of small solder balls which form relatively weak solder joints and can be aggravated on substrate warpage occasion when package height needs to be reduced. The protrusion 226 also serves to eliminate the use of a step-molded PoP bottom package when package height needs to be reduced, which requires partial sawing processes that may incur damage and embed mold compound particles into the bottom package's solder-on-pad (SOP) surfaces. Having stronger solder joints and avoiding sawing processes increase interconnect reliability of the integrated circuit packaging system 100. The protrusion 226 with the bottom end 222 of the via holes 216 entirely overlapping at least one surface of the protrusion 226 thereby increases interconnect reliability.

For illustrative purposes, the integrated circuit packaging system 100 is shown with the substrate 104 having the via holes 216 of the same geometric shape, although it is understood that the relative sizes and geometry of the via holes 216 can vary across the substrate 104. For example, the via holes 216 for power transmission can have wider surface areas on the top end 220 and the bottom end 222 than the via holes 216 for signal transmission.

The integrated circuit packaging system 100 can include an encapsulation 230, a protective cover for the integrated circuit packaging system 100, such as a molding compound. The encapsulation 230 can cover the pads 106 and the die 112, leaving the protrusion 226 exposed.

Figure 3:
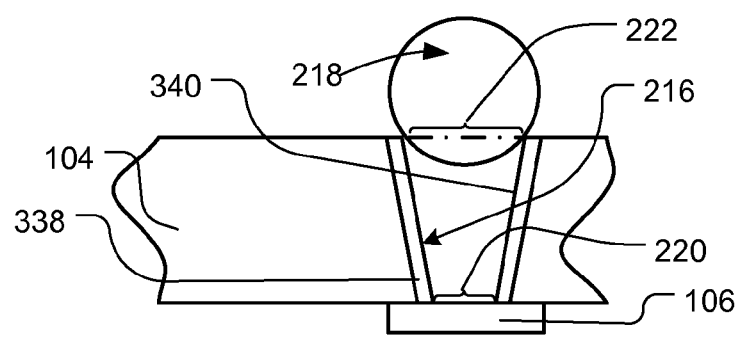
FIG. 3 is a detailed cross-sectional view of the substrate of the integrated circuit packaging system of FIG. 2 in a filler application stage of manufacturing of the integrated circuit packaging system.

Referring now to FIG. 3, therein is shown a detailed cross-sectional view of the substrate 104 of the integrated circuit packaging system 100 of FIG. 2 in a filler application stage of manufacturing of the integrated circuit packaging system 100. FIG. 3 shows the substrate 104 of the integrated circuit packaging system 100 of FIG. 2 where the substrate 104 can include the via holes 216 having the bottom end 222 larger than the top end 220. The bottom end 222 being larger than the top end 220 will reflect the shape of the conductive filler 218 having a larger surface area near the bottom end 222 of the via holes 216 and a smaller surface area near the top end 220 of the via holes 216.

The via holes 216 can also have a conformal shell 338. The conformal shell 338 is defined as conformal plating on an interior wall 340 of the via holes 216, such as by copper electroplating. Conformal plating is an even growth from all surfaces resulting in a deposit of equal thickness at all points. For example, the via holes 216 are not fully plated with copper, instead, only its walls are conformally plated with the conformal shell 338, such as materials having good adhesion with solders and laminate materials.

It has been discovered that the present invention provides the integrated circuit packaging system 100 having reduced manufacturing complexity and minimizes defect possibility. Conformal plating only the conformal shell 338 in the via holes 216 serves to eliminate extra manufacturing steps because the via holes 216 are only conformally plated thus making under bump metallization and solder mask unnecessary. Eliminating extra manufacturing steps reduces manufacturing complexity and minimizes defect possibility. Conformal plating only the conformal shell 338 in the via holes 216 thereby reduces manufacturing complexity and minimizes defect possibility.

For example, each of the via holes 216 can be a truncated cone shape. In the example, the via holes 216 can have the interior wall 340 that tapers smoothly from the bottom end 222 having a flat circular or oval shape to the top end 220 having a flat circular or oval shape.

During the filler application stage of manufacturing, the conductive filler 218, such as solder balls, is placed onto the via holes 216 and reflowed, filling up the via holes 216. The filler application stage can be performed with the substrate 104 inverted such that the conductive filler 218 can fill up the via holes 216 during reflow. The volume of each of the conductive filler 218 can be higher than each of the via holes 216, such that post reflow, the conductive filler 218 will be protruding out. The conductive filler 218 is in direct contact with the conformal shell 338.

The filler application stage of manufacturing can occur after encapsulation of the integrated circuit packaging system 100. The via holes 216 can be filled with the conductive filler 218 simultaneously as the protrusion 226 of FIG. 2 is formed, by for example screen printing. The pads 106 can block the movement of the conductive filler 218 during the filler application stage of manufacturing, allowing the protrusion 226 to form on the bottom end 222 of the via holes 216.

It has been discovered that the present invention provides the integrated circuit packaging system 100 having increased ease of packages interconnection. The conductive filler 218 with the protrusion 226 serves to eliminate the difficulty of solder ball placement, especially in warped laminate substrates. The integrated circuit packaging system 100 can avoid the difficulty of placing solder balls precisely on contact pads because the protrusion 226 is formed as a part of the conductive filler 218. The conductive filler 218 with the protrusion 226 also serves to prevent missing solder balls usually found in imprecise ball placement in warped substrate. Elimination of solder placement difficulty and of the missing solder ball problem increases the ease of packages interconnection. The conductive filler 218 with the protrusion 226 thereby increases ease of packages interconnection.

Figure 4:
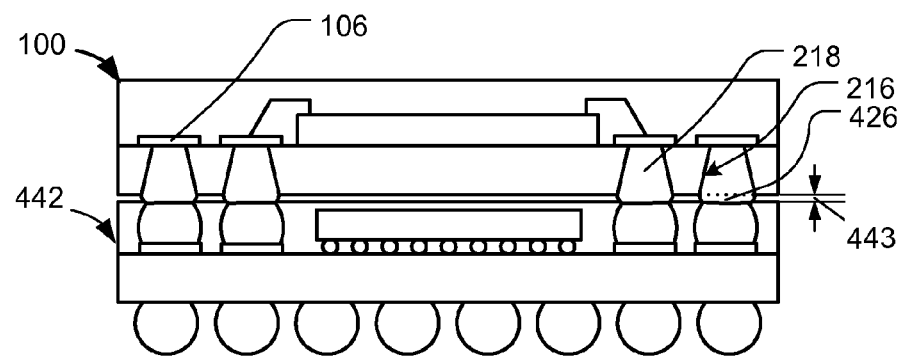
FIG. 4 is a cross-sectional view of the integrated circuit packaging system of FIG. 2 mounted on an external stack package.

Referring now to FIG. 4, therein is shown a cross-sectional view of the integrated circuit packaging system 100 of FIG. 2 mounted on an external stack package 442. The conductive filler 218 in the via holes 216 with a protrusion 426 can function as both an electrical connection as well as a spacer between the integrated circuit packaging system 100 and the external stack package 442. The external stack package 442 is an external electrical component or package such as a PoP bottom package, a fan-in PoP bottom package, a fan-out PoP bottom package, an electrical component package, a flip chip package, a Quad Flat Package (QFP), a Quad Flat No Leads (QFN) package, a Ball Grid Array (BGA) package, a Land Grid Array (LGA) package, or other packages with embedded or exposed solder on pads (e-SOP).

The integrated circuit packaging system 100 can be mounted over and on the external stack package 442. A reflow process can take place to create an electrical connection as well as a space 443 between the integrated circuit packaging system 100 and the external stack package 442. The pads 106 of the integrated circuit packaging system 100 will prevent the movement of the conductive filler 218 upwards during reflow, and the embedded or exposed solder on pads of the external stack package 442 can prevent the movement of the conductive filler 218 downwards during reflow. The space 443 remains between the integrated circuit packaging system 100 and the external stack package 442, having a much narrower height than convention package-on-package packaging systems.

It has been discovered that the present invention provides the integrated circuit packaging system 100 having increased ease to mount and to electrically connect bottom packages. The protrusion 426 serves to function as both a spacer and an electrical connector. The protrusion 426 can act both as an electrical conductor and a spacer between the integrated circuit packaging system 100 and the external stack package 442. The protrusion 426 serving as both an electrical conductor and a spacer eliminates the need to hold the external stack package 442 in place mechanically relative to a top package. The protrusion 426 thereby increases the ease of mounting and electrically connecting the integrated circuit packaging system 100 onto bottom packages.

Figure 5:
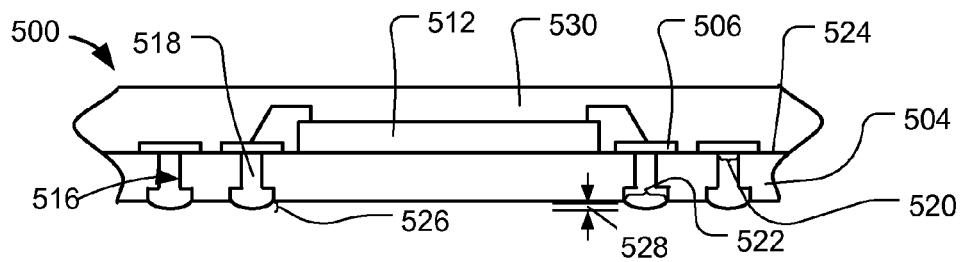
FIG. 5 is a cross-sectional view of an integrated circuit packaging system as exemplified by the top view of FIG. 1 along line 2-2 of FIG. 1 in a second embodiment of the present invention.

Referring now to FIG. 5, therein is shown a cross-sectional view of an integrated circuit packaging system 500 as exemplified by the top view of FIG. 1 along line 2-2 of FIG. 1 in a second embodiment of the present invention. The integrated circuit packaging system 500 can include a substrate 504. The substrate 504 is defined as a chip carrier such as a laminated substrate or a ceramic substrate.

The substrate 504 can include via holes 516 formed on the substrate 504. The via holes 516 are defined as small apertures formed on the substrate 504 and through the substrate 504. The via holes 516 can be filled with a conductive filler 518, such as solder or other conductive materials, the conductive filler 518 functions as a channel for electric power or signal path between one surface of the substrate 504 and another surface of the substrate 504. The via holes 516 can be formed by a number of different methods, such as a die set rigid punch arrays, numerically controlled punches, drills, etches, or lasers.

Each of the via holes 516 can include a top end 520 and a bottom end 522. The top end 520 is defined as an opening of each the via holes 516 facing a top side 524 of the substrate 504. The bottom end 522 of the via holes 516 is defined as an opening of each of the via holes 516 on the opposite side from the top end 520. Each of the via holes 516 can be, for example, a step aperture shape. A step aperture shape has a narrow channel from the top end 520 of the via holes 516 extending downwards opening into a wider portion near the bottom end 522 of the via holes 516.

The integrated circuit packaging system 500 can also include pads 506, such as conductive plates, on the substrate 504. Each of the pads 506 is coplanar with the top side 524 of the substrate 504. The pads 506 can be formed on the substrate 504 by a number of different methods, such as welding, plating, etching a pre-existing metal layer, or metal deposition. The pads 506 can be made from metallic materials, such as copper, platinum, gold, silver, solder-wettable metals, or a combination thereof.

Each of the via holes 516 can have a corresponding instance of the pads 506 enclosing the top end 520 of each of the via holes 516. Each of the pads 506 can be larger than the top end 520 of each of the via holes 516 in order to assure that during a reflow stage of manufacturing, the conductive filler 518 cannot travel upward through the top end 520 of the via holes 516. The pads 506 can be plated or coated with filler-wettable or solder-wettable material on either of its sides.

Each of the via holes 516 can be filled with the conductive filler 518, such as solder. The conductive filler 518 is defined as fusible metal or metal alloy with a melting range or a melting point lower than that of the melting point of the substrate 504, used in a process of joining metallic surfaces. The conductive filler 518 can fill the entirety of the via holes 516. The conductive filler 518 can have a protrusion 526 outside of the bottom end 522 of the via holes 516 with a protrusion height 528 of at least between 10 µm to 245 µm, or preferably between 25 µm to 60 µm, or most preferably between 50 µm to 100 µm.

The protrusion 526 can be in the shape of a hemisphere, where the bottom surface of the hemisphere is the same shape and size as the bottom end 522 of the via holes 516. The protrusion 526 can also be in a shape of a polygon-bottom dome, where the bottom surface of the dome is the same shape and size as the bottom end 522 of the via holes 516. The bottom end 522 of the via holes 516 can entirely overlap at least one surface of the protrusion 526.

For illustrative purposes, the integrated circuit packaging system 500 is shown with the substrate 504 having the via holes 516 of the same geometric shape, although it is understood that the relative sizes and geometry of the via holes 516 can vary across the substrate 504. For example, the via holes 516 for power transmission can have a wider surface area than the via holes 516 for signal transmission.

The integrated circuit packaging system 500 can include an encapsulation 530, a protective cover for the integrated circuit packaging system 100, such as a molding compound. The encapsulation 530 can cover the pads 506 and a die 512, leaving the protrusion 526 exposed.

Figure 6:
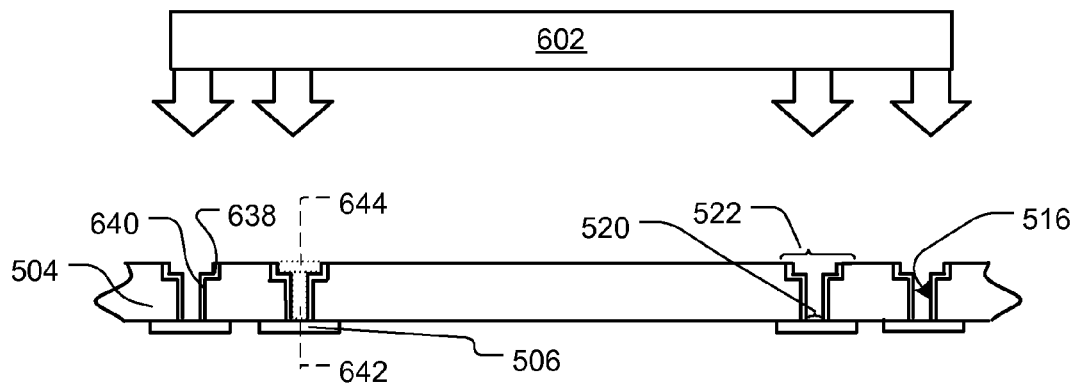
FIG. 6 is a detailed cross-sectional view of the substrate of the integrated circuit packaging system of FIG. 5 in a filler application stage of manufacturing of the integrated circuit packaging system.

Referring now to FIG. 6, therein is shown a detailed cross-sectional view of the substrate 504 of the integrated circuit packaging system 500 of FIG. 5 in a filler application stage 602 of manufacturing of the integrated circuit packaging system 500. The filler application stage 602 involves applying the conductive filler 518 of FIG. 5, such as in the form of solder balls, onto the via holes 516 of the substrate 504. Applying the conductive filler 518 can include placing the conductive filler 518 having a greater volume than the via holes 516 onto the via holes 516, and reflowing the conductive filler 518.

FIG. 6 shows the substrate 504 of the integrated circuit packaging system 500 of FIG. 5 where the substrate 504 can include the via holes 516 having the bottom end 522 larger than the top end 520. The bottom end 522 being larger than the top end 520 will reflect the shape of the conductive filler 518 having a larger surface area near the bottom end 522 of the via holes 516 and a smaller surface area near the top end 520 of the via holes 516.

Each of the via holes 516 can be, for example, a step aperture shape. A step aperture shape has a narrow channel 642 from the top end 520 of the via holes 516 extending downwards opening into a wider portion 644 adjacent to the bottom end 522 of the via holes 516.

It has been discovered that the present invention provides the integrated circuit packaging system 500 having increased interconnect reliability and substrate reliability. The via holes 516 with a step aperture shape serve to allow a larger pad over the top end 520 of the via holes 516 while having the bottom end 522 larger than the top end 520 to provide a wider interconnect surface with external stack packages and systems. The via holes 516 with a step aperture shape also serve to provide the above features while having minimal drilling through most of the substrate 504. A larger pad over the top end 520 and a wider interconnect surface on the bottom end 522 increase interconnect reliability of the integrated circuit packaging system 100. Providing minimal drilling through most of the substrate 504 provides substrate reliability. The via holes 516 with a step aperture shape thereby increase interconnect reliability and substrate reliability.

The via holes 516 can also have a conformal shell 638. The conformal shell 638 is defined as conformal plating on an interior wall 640 of the via holes 516. Conformal plating is an even growth from all surfaces resulting in a deposit of equal thickness at all points. For example, the via holes 516 are not fully plated with copper, instead, only its walls are conformally plated with the conformal shell 638, such as materials having good adhesion with solders and laminate materials.

It has been discovered that the present invention provides the integrated circuit packaging system 500 having reduced manufacturing complexity and minimizes defect possibility. Conformal plating only the conformal shell 638 in the via holes 516 serves to eliminate extra manufacturing steps because the via holes 516 are only conformally plated thus making under bump metallization and solder mask unnecessary. Eliminating extra manufacturing steps reduces manufacturing complexity and minimizes defect possibility. Conformal plating only the conformal shell 638 in the via holes 516 thereby reduces manufacturing complexity and minimizes defect possibility.

During the filler application stage 602 of manufacturing, the conductive filler 518, such as solder balls, is placed onto the via holes 516 and reflowed, filling up the via holes 516. The filler application stage can be performed with the substrate 504 inverted such that the conductive filler 518 can fill up the via holes 516 during reflow. The volume of each of the conductive filler 518 can be higher than each of the via holes 516, such that post reflow, the conductive filler 518 will be protruding out. The filler application stage 602 of manufacturing can occur after encapsulation of the integrated circuit packaging system 500. The via holes 516 can be filled with the conductive filler 518 simultaneously as the protrusion 526 is formed, by for example screen printing. The pads 506 can block the movement of the conductive filler 518 during the filler application stage of manufacturing, allowing the protrusion 526 to form on the bottom end 522 of the via holes 516.

Figure 7:
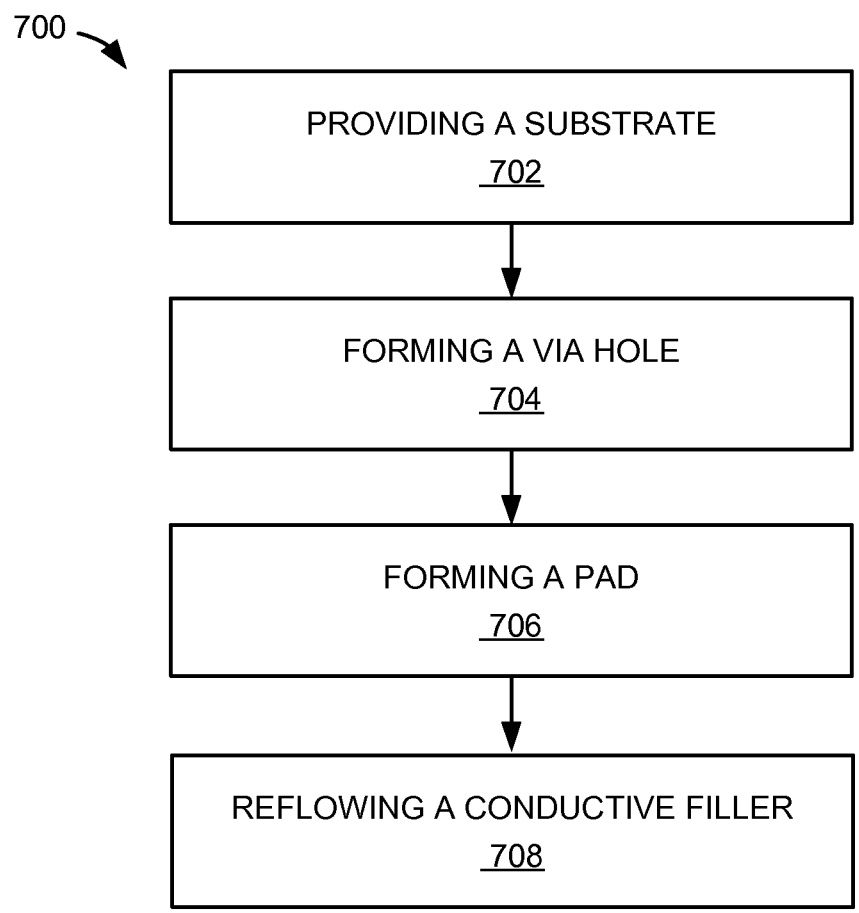
FIG. 7 is a flow chart of a method of manufacture of the integrated circuit packaging system in a further embodiment of the present invention.

Referring now to FIG. 7 therein is shown a flow chart of a method 700 of manufacture of the integrated circuit packaging system in a further embodiment of the present invention. The method 700 includes: providing a substrate, in a block 702; forming a via hole in the substrate, the via hole having a top end and a bottom end with the bottom end is larger than the top end, in a block 704; forming a pad on the substrate, the pad encloses the top end of the via hole, in a block 706; and reflowing a conductive filler having higher volume than the via hole over the via hole, the conductive filler having a protrusion extending from the bottom end and the bottom end entirely overlaps at least one surface of the protrusion, in a block 708.

The resulting method, process, apparatus, device, product, and system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in art in light of aforegoing description. Accordingly, it is intended to embrace all such alternatives, modifications, and variations that fall within the scope of the included claims. All matters hithertofore set forth herein or shown in accompanying drawings are to be interpreted in an illustrative and non-limiting sense.

What is claimed is:

1. A method of manufacture of an integrated circuit packaging system comprising:
   providing a substrate;
   forming a via hole in the substrate, the via hole having a top end and a bottom end with the bottom end is larger than the top end;
   forming a pad on the substrate, the pad encloses the top end of the via hole;
   forming a conformal shell in the via hole, the conformal shell in direct contact with the substrate; and
   reflowing a conductive filler having higher volume than the via hole and in direct contact with the conformal shell, the conductive filler having a protrusion extending from the bottom end and the bottom end entirely overlaps at least one surface of the protrusion.

2. The method as claimed in claim 1 wherein forming the via hole in the substrate includes forming the via hole having an interior wall tapered smoothly from the bottom end with a flat circular or oval shape to the top end with a flat circular or oval shape.

3. The method as claimed in claim 1 wherein forming the via hole in the substrate includes forming the via hole having a narrow channel from the top end extending downwards into a wider portion adjacent to the bottom end.

4. The method as claimed in claim 1 wherein reflowing the conductive filler includes forming the protrusion having a polygon-base dome shape or a hemisphere shape.

5. The method as claimed in claim 1 further comprising forming a further via hole in the substrate, the bottom end of the further via hole larger than the bottom end of the via hole.

6. A method of manufacture of an integrated circuit packaging system comprising:
   providing a substrate;
   forming a via hole in the substrate, the via hole having a top end and a bottom end with the bottom end is larger than the top end;
   forming a pad on the substrate, the pad encloses the top end of the via hole;
   plating a conformal shell on an interior wall of the via hole, the conformal shell direct contact with the substrate; and
   reflowing a conductive filler having higher volume than the via hole and in direct contact with the conformal shell, the conductive filler having a protrusion extending from the bottom end and the bottom end entirely overlaps at least one surface of the protrusion.

7. The method as claimed in claim 6 further comprising attaching the protrusion on an external stack package for electrical connection and for a structural spacing.

8. The method as claimed in claim 6 wherein reflowing the conductive filler includes forming the protrusion having a protrusion height in a range of 10 µm to 245 µm.

9. The method as claimed in claim 6 wherein forming the pad on the substrate includes forming the pad larger than the top end.

10. The method as claimed in claim 6 further comprising encapsulating the pad having the protrusion exposed.

11. An integrated circuit packaging system comprising:
   a substrate having a via hole in the substrate, the via hole having a top end and a bottom end with the bottom end is larger than the top end;
   a pad over the top end of the via hole;
   a conformal shell on an interior wall of the via hole, the conformal shell in direct contact with the substrate; and a conductive filler filled into the via hole and in direct contact with the conformal shell, the conductive filler having a protrusion extending out of the via hole from the bottom end with the bottom end entirely overlapping at least one surface of the protrusion.

12. The system as claimed in claim 11 wherein the via hole has a truncated cone shape.

13. The system as claimed in claim 11 wherein the via hole has a step aperture shape.

14. The method as claimed in claim 11 wherein the protrusion has a polygon-base dome shape or a hemisphere shape.

15. The system as claimed in claim 11 wherein the substrate having a further via hole, the bottom end of the further via hole larger than the bottom end of the via hole.

16. The system as claimed in claim 11 wherein:
the conformal shell has an equal thickness on surfaces of the interior wall.

17. The system as claimed in claim 16 wherein the protrusion is for electrical connection and for a structural spacing to an external stack package.

18. The system as claimed in claim 16 wherein the protrusion having a protrusion height in a range of 10 μm to 245 μm.

19. The system as claimed in claim 16 wherein the pad larger than the top end.

20. The system as claimed in claim 16 further comprising:
an encapsulation over the pad and the substrate having the protrusion exposed.

* * * * *